United States Patent
Xing et al.

(10) Patent No.: US 11,356,111 B1
(45) Date of Patent: Jun. 7, 2022

(54) SELF CALIBRATING DIGITAL-TO-ANALOG CONVERTER

(71) Applicant: NXP B.V., Eindhoven (NL)

(72) Inventors: Hanging Xing, Sunnyvale, CA (US); Ronak Prakashchandra Trivedi, Cupertino, CA (US); Jean CauXuan Le, Santa Clara, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/249,754

(22) Filed: Mar. 11, 2021

(51) Int. Cl.
  *H03M 1/10* (2006.01)
  *H04B 1/06* (2006.01)

(52) U.S. Cl.
  CPC .............. *H03M 1/1028* (2013.01); *H04B 1/06* (2013.01)

(58) Field of Classification Search
  CPC ................................. H03M 1/1028; H04B 1/06
  USPC .................................................. 341/120, 144
  See application file for complete search history.

(56) References Cited

U.S. PATENT DOCUMENTS

| | | | |
|---|---|---|---|
| 8,330,634 B2 | 12/2012 | Li et al. | |
| 9,337,860 B1 | 5/2016 | Li et al. | |
| 9,379,728 B1 * | 6/2016 | Singh | H03M 1/1047 |

OTHER PUBLICATIONS

Pastre, M. et al. "High-Precision Dac Based on a Self-Calibrated Sub-Binary Radix Converter", IEEE International Symposium on Circuits and Systems, 4 pgs, (Apr. 23, 2004).

* cited by examiner

*Primary Examiner* — Khai M Nguyen

(57) ABSTRACT

A self-calibrating digital-to-analog converter (DAC) is disclosed. The self-calibrating DAC includes an input port, a non-binary DAC, an ADC to receive an output of the non-binary DAC, a lookup table to store a plurality of calibration code and a calibration logic coupled with the non-binary DAC. The self-calibrating DAC has two modes of operations, a calibration mode and a normal operational mode. In the calibration mode, the self-calibrating DAC is configured to calculate weightages of the non-binary DAC and to calculate an offset coefficient and a gain coefficients using high precision on chip analog-to-digital converter (ADC).

19 Claims, 5 Drawing Sheets

SELF CALIBRATING DIGITAL-TO-ANALOG CONVERTER

BACKGROUND

A digital-to-analog converter (DAC) is a circuit that converts a digital signal into an analog signal. An analog-to-digital converter (ADC) performs the reverse function. There are several DAC architectures; the suitability of a DAC for a particular application is determined by figures of merit including: resolution, maximum sampling frequency and others. In principle, a digital signal is inputted to a DAC and the DAC outputs an accurate output voltage. In reality, the accuracy of the output voltage is subject to gain, offset and nonlinear errors from the DAC and other components in the signal chain. The DAC circuit should compensate for these errors in order to get an accurate output voltage. This error correction can be implemented with external components and post-manufacture trimming. Digital calibration modifies the input sent to the DAC such that the gain, offset and nonlinear errors are taken into account thus removing the need for external components and trimming.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a self-calibrating digital-to-analog converter (DAC) is disclosed. The self-calibrating DAC includes an input port, a non-binary DAC, an ADC including a modulator and digital filter to receive an output of the non-binary DAC and a lookup table to store a plurality of calibration codes. The self-calibrating DAC further includes a calibration logic coupled with the non-binary DAC and in a calibration mode, the calibration logic is configured to calculate bit weightages of the non-binary DAC using a calibration code in the plurality of calibration codes and to calculate an offset coefficient and a gain coefficient of the non-binary DAC. A conversion module is included to convert, in a normal mode, an input code received via the input port, to a calibrated code using the weightages and the offset & gain coefficients.

In another embodiment, a method for self-calibrating a digital-to-analog converter (DAC) is disclosed. The method may be performed in two operational modes, a calibration mode and a normal mode. In the calibration mode, the method includes calculating bit weightages of a non-binary DAC using an ADC, calculating an offset coefficient of the non-binary DAC and calculating a gain coefficient of the non-binary DAC. In the normal mode, the method includes converting an input digital code to a calibrated non-binary input code using the weightages, the offset coefficient and the gain coefficient. The converting may include reading an input code and multiplying the input code by the gain coefficient and adding the offset coefficient.

In some examples, a memory is included to store the weight and the offset & gain coefficient that are calculated during the calibration mode. The weight is calculated for a selected bit of the non-binary DAC by measuring an output of the non-binary DAC using the ADC after setting the selected input bit of the non-binary DAC to 1 and setting all other input bits of the non-binary DAC to 0. The selected bit of the non-binary DAC is incremented to a next bit until all input bits of the raw DAC are processed using a loop. The loop is executed for a number of times equal to a resolution of the raw non-binary DAC. The offset & gain coefficients are calculated by inputting a zero scale voltage to the ADC to obtain a zero scale calibration code ($C_{ZS}\_cal$) from the ADC. The offset & gain coefficients are calculated by inputting a full scale voltage to the ADC to obtain a full scale calibration code ($C_{FS}\_cal$) from the ADC. The offset coefficient is calculated by subtracting a zero scale code from $C_{ZS}\_cal$, wherein the zero scale code is obtained at the output of the ADC by inputting a zero scale code from the lookup table into the non-binary DAC. The gain coefficient is calculated using an equation $(C_{FS}\_cal - C_{ZS}\_cal)/(2^{N_{DAC}\_cal} - 1)$, wherein $N_{DAC}\_cal$ is a resolution of the self-calibrating DAC after calibration.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Figure 1:
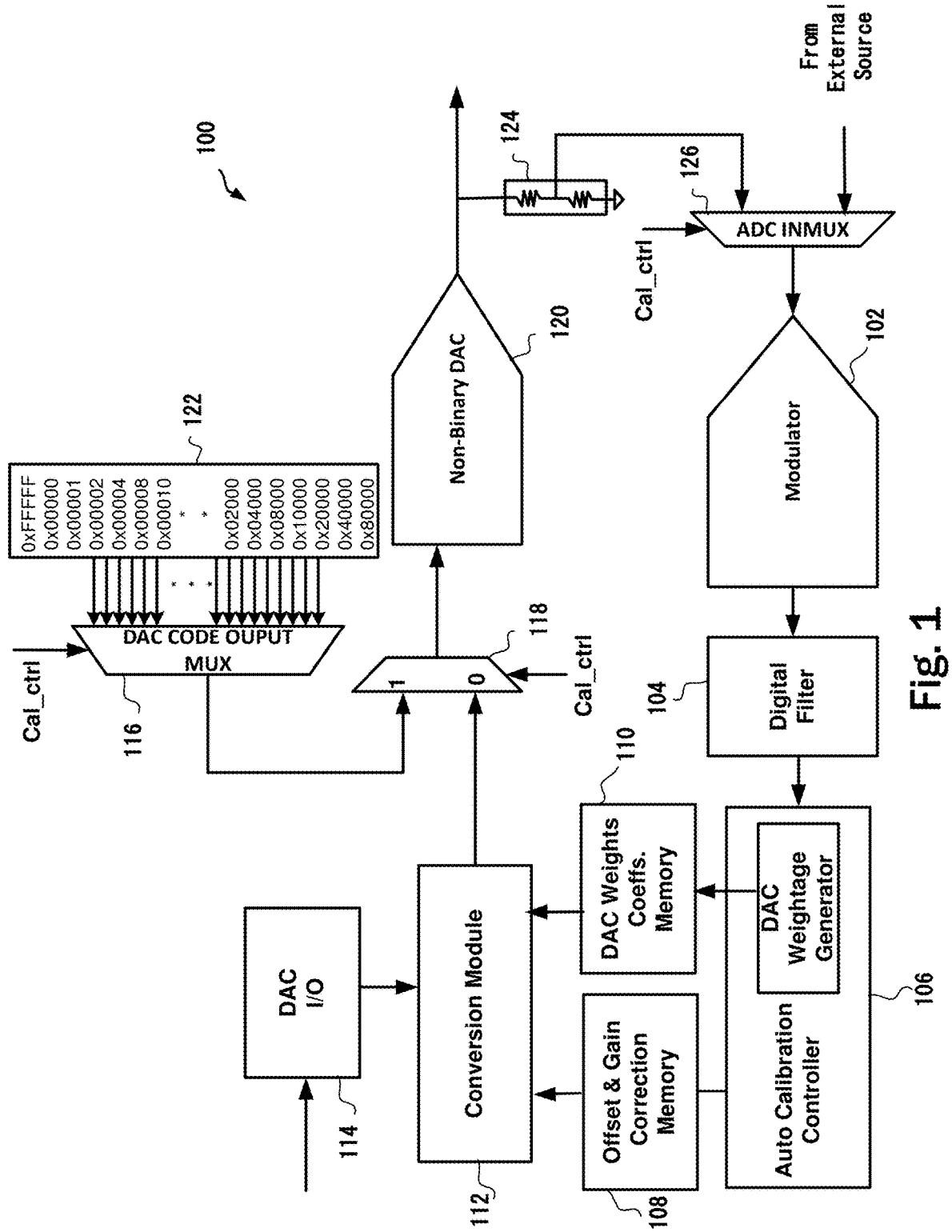
FIG. 1 depicts an on-chip DAC self-calibration system in accordance with one or more embodiments of the present disclosure.

Note that figures are not drawn to scale. Not all components of the improved ground switch are shown. The omitted components are known to a person skilled in the art.

DETAILED DESCRIPTION

Many well-known manufacturing steps, components, and connectors have been omitted or not described in details in the description so as not to obfuscate the present disclosure.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", "one example", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

A precision transmitter/receiver system typically includes high-resolution digital-to-analog converters (DAC) and analog-to-digital converters (ADC). For example, in industrial input/output applications, it's becoming more demanding to have a ~16-bit accurate transmitting path and a greater than 20-bit accurate receiving path integrated in a single-chip solution. Usually, a high-resolution delta-sigma ADC (which includes a modulator and a digital filter) is used for the input quantization because of its high resolution and inherent linearity. Furthermore, the noise level of the delta-sigma ADC can be well controlled by having enough over sampling ratio (OSR). There is not much high-accuracy trimming and calibration necessary for the ADCs. On the transmitting side, a highly linear DAC is required to provide accurate output levels. However, high accuracy DACs are not straightforward to implement and usually involve highly accurate and costly analog trimming procedures. The non-binary DAC structure is capable of generating fine-resolution levels but its linearity is limited by the accuracy of the analog measurements of its bit weightages.

In the examples described herein, the DAC calibration is performed using an on-chip delta sigma ADC that is configured to be more accurate than the desired DAC's linearity, and there is no need to send the critical analog voltage signals off chip for DAC calibration. The calibration is performed in digital domain with the same resolution as ADC's digital outputs. Among others, the advantages of the embodiments described herein includes: 1) high-accuracy measurements are performed on chip for a better repeatability measurement result compared to if the measurements are done off-chip, 2) no expensive hardware overhead is required when these measurements are done on-chip, and 3) the calibration can be performed in the background to avoid high cost of long test time.

The system and method described herein first measures all weightages of raw non-binary DAC using the high-accuracy ADC. A linear output transfer function in digital domain is built by eliminating the redundancy of the DAC based on the conversion. For each input to DAC, a digital calibration logic finds out raw DAC controlling bits using measured weightages, offset and gain coefficients.

The embodiments described herein provide a DAC calibration system and procedure to correct nonlinear errors and redundancy of non-binary resistive DACs. These embodiments also provide an on-chip background calibration architecture to reduce costly external hardware overhead for high-accuracy measurements and extremely long test time and enables a simple and short signal path of self-calibration to improve measuring repeatability and calibration accuracy.

FIG. 1 depicts an on-chip DAC self-calibration system 100. In some examples, the DAC self-calibration system 100 is fabricated in one chip with an on-chip loopback system for self-calibration. The DAC self-calibration system 100 may include a high-precision non-binary DAC 120 in the output path and an ADC (which includes a modulator 102 and a digital filter 104) in the input path. A digital filter 104 may be included to receive and filter the output of the delta-sigma modulator 102. At the output of the digital filter 104, an auto calibration controller 106 may be included. The self-calibration controller 106 includes a DAC weightage generator. A DAC weights coefficients memory 110 may be included to store DAC weights generated by the DAC weightage generator. An offset & gain correction memory 108 may be included to store the offset & gain correction coefficients generated by the auto calibration controller 106. In some examples, the DAC weights coefficient memory 110 and the offset & gain correction coefficients memory 108 may be implemented as a single module. A conversion module 112 may be included to generate a raw DAC input code based on the outputs from the auto calibration controller 106 and an external input through a DAC input/output (EO) port 114. The delta-sigma modulator 102 may receive an input via an input multiplexer (INMUX) 126. In some examples, the modulator 102 and the digital filter 104 may be a part of an ADC that is available in the same integrated circuit. In some applications such as a communication sub-system that sends and receives data, an ADC may exist on the receiver side and at least some parts (e.g., the modulator 102 and the digital filter 104) of the ADC may be used to provide self-calibration features described herein. The input mux 126 enables the input from the non-binary DAC 120 during the calibration mode and the input from an external source is enabled during the normal operation mode. In some examples, the input from the external source may also be derived from the non-binary DAC 120. A buffer or lookup table 122 may be included to store calibration codes. A DAC code output multiplexer 116 receives inputs from the lookup table 122 and outputs selected one of those DAC calibration codes at a time when the cal_ctrl (calibration mode enabled) signal is on. The DAC calibration code is inputted to a DAC input multiplexer 118 that selects one of the output of the DAC code mux 116 or the conversion module 112. During the calibration mode, the DAC input multiplexer 118 selects a code from the lookup table 122 and during the normal mode, the digital input received via the DAC EO 114 and calibrated using the pre-calculated offset/gain correction coefficients and weight coefficients, is inputted to the non-binary DAC 120.

The lookup table 122 includes pre-configured digital calibration codes for which expected analog outputs (after the input calibration code is converted to an analog output by the non-binary DAC 120) is known. During the calibration mode, the auto calibration controller 106 generates non-binary DAC weightages by applying the digital codes stored in the lookup table 122. The auto calibration controller 106 also generates offset and gain correction coefficients for the non-binary DAC input bits. The generated weightages and coefficients are stored in a memory and used to calibrate the digital inputs to the non-binary DAC 120 during the normal mode.

During the calibration phase, the outputs of the non-binary DAC 120 are sent back to the input of the delta-sigma modulator 102 through a level-shifter 124. The level-shifter 124 may ensure that the full DAC output range is within the input range of the delta-sigma modulator 102. The ADC multiplexer 126 at the input of the delta-sigma modulator 102 may be used to enable the selection of the input signals between internal DAC outputs and external analog inputs. The calibration process may be configured to be controlled by the auto calibration controller 106. During the calibration, the DAC input mux 118 selects DAC calibration codes from the lookup table 122. Sequentially, the non-binary DAC 120 may generate outputs of its zero-scale output, full-scale output, and each bit weight from least significant bit (LSB) to most significant bit (MSB) by enabling the corresponding calibration code in the lookup table 122. The DAC outputs (from the non-binary DAC 120) may be used by the delta-sigma modulator 102 and the digital filter 104 to generate weight coefficients and Offset & gain coefficients. The ADC inputs received via the ADC multiplexer 126 may be used to generate offset and gain error correction coefficients and perform measurements of external signal during normal operation.

Figure 2:
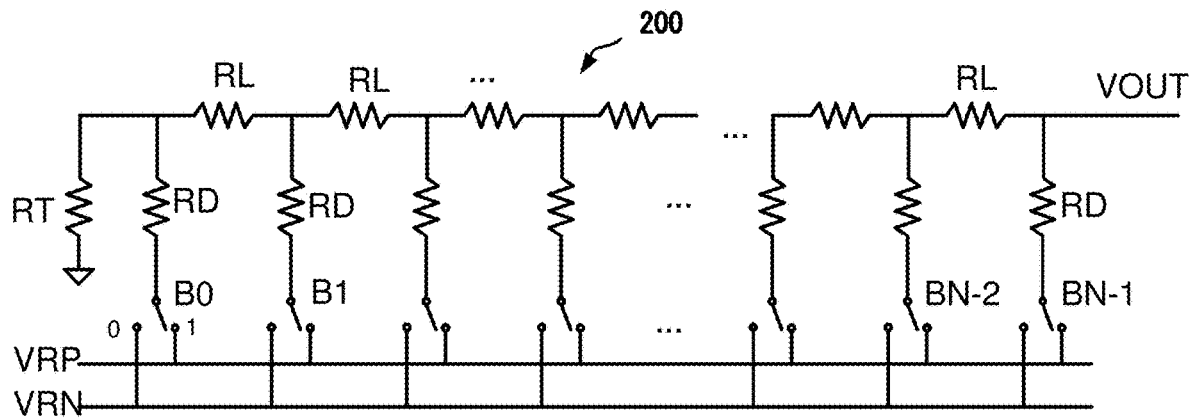
FIG. 2 depicts a non-binary resistive DAC architecture in accordance with one or more embodiments of the present disclosure.

FIG. 2 depicts a non-binary resistive DAC architecture 200. Converting an "n"-bit digital input code into an equivalent analog output voltage between $V_{MIN}$ and some $V_{MAX}$ value can be done using a weighted resistors and a summing amplifier or a resistor ladder network and operational amplifier. The digital-to-analog conversion method produce a weighted sum output, with the weights set by the resistive values used in the ladder networks contributing a different "weighted" amount to the signals output. The resistive network 200 includes resistors RT, RD and RL and switches B0, B1 ... BN-2, BN-1. An output port VOUT is included. Two inputs VRP, VRN are also included. To achieve a desired resolution (e.g., to cover the DAC output range with configurable steps), in some examples, the redundancy may be introduced by having bit weightage ratio of two successive bits less than 2. The lower the weightage ratio is, the more redundancy (output overlapping) the non-binary DAC 120 is obtained. In some examples, a bit weightage ratio may be determined by matching properties of the resistors RT, RD and RL.

Figure 3:
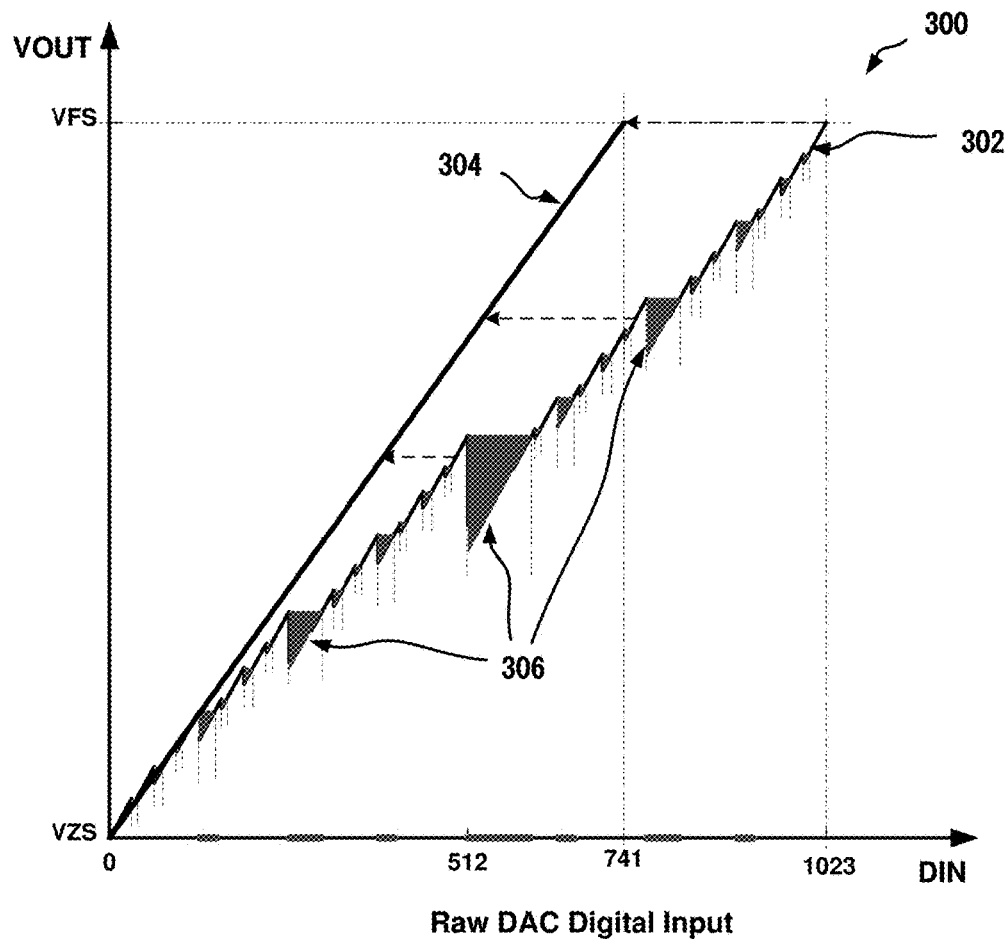
FIG. 3 shows a 10-bit non-binary DAC transfer curve with redundancy and non-linearities and a calibrated DAC transfer curve with redundancy and non-linearities removed in accordance with one or more embodiments of the present disclosure.

FIG. 3 shows a graph 300 that includes a 10-bit non-binary DAC transfer curve 302 with redundancy and non-linearities and a calibrated DAC transfer curve with redundancy and non-linearities removed 304. In the transfer curve 302, the redundancy of the DAC is shown by the non-monotonic transfer curve. The embodiments described herein achieve the curve 304 by removing the non-linearities through the self-calibration process.

The non-binary ratio of the DAC that causes the non-monotonic part 306 of the transfer curve 302 are removed through the calibration process described herein. The resolution of the curve 304 may be limited by the number of outputs in the transfer curve, 742 for example, and the random mismatch errors of the resistors RT, RD, RL. In general, the resolution and linearity of the final calibrated DAC may be several bits less than the raw DAC's resolution (e.g., the resolution of the non-binary DAC 120 if used independently without the self-calibration system shown in FIG. 1). In the calibration mode, $V_{ZS}$ (e.g., the voltage produces by an DAC input with all bits set to 0) and $V_{FS}$ (e.g., the voltage produced by an DAC input with all bits set to 1) are measured. The analog bit weightages may also be measured by the DAC weightage generator using an ADC (for example).

During the normal operation, the transfer characteristics of the calibrated DAC 100 are pre-determined by the system requirements. As long as the transfer characteristics are within the output range of the non-binary DAC 120, for example from $V_{ZS}$ to $V_{FS}$, the targeted transfer curve (e.g., the curve 304) can be derived from the non-binary DAC 120 output. The next step is to find the corresponding raw DAC input that generate the desired output transfer curve 304 through the calibrated DAC to raw DAC input code mapping.

Figure 4:
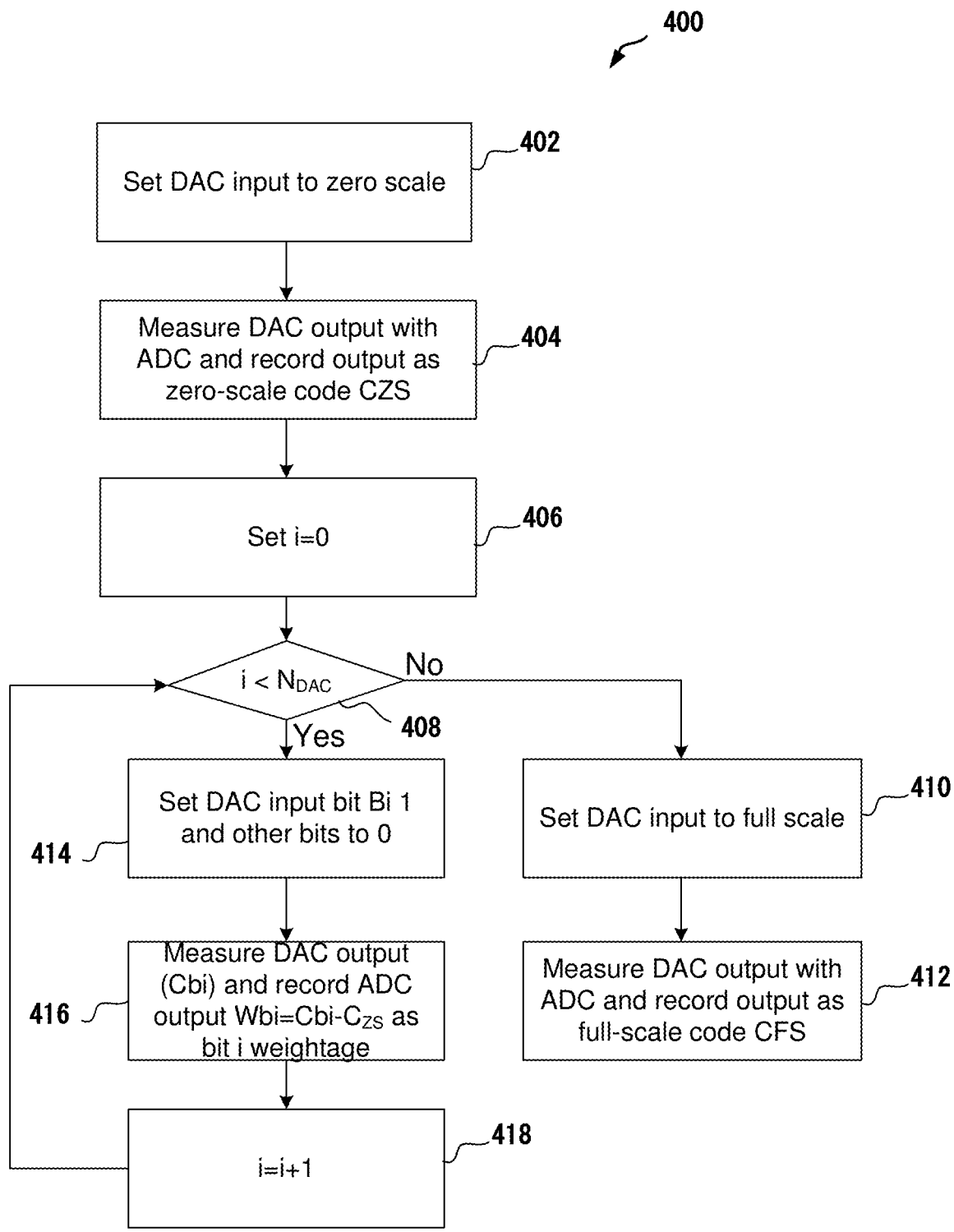
FIG. 4 depicts a flow chart of a method for DAC weightage characterization with a ADC in accordance with one or more embodiments of the present disclosure.

FIG. 4 depicts a flow chart 400 of a method for DAC weightage characterization with an ADC modulator (e.g., a delta-sigma ADC). Modulation is a method for encoding analog signals into digital signals as found in an analog-to-digital converter (ADC). Assuming the non-binary DAC 120 resolution is $N_{DAC}$ bits with input bits represented by B0, B1, ... $BN_{DAC}-1$ from LSB to MSB. In the calibration mode, at step 402, the DAC input calibration code is set to zero scale (ZS), that is, the first code 0x00000 is chosen from the lookup table 122, and this code is inputted to the non-binary DAC 120. At step 404, the output ($V_{ZS}$) of the non-binary DAC 120 is measured using the ADC (that includes the modulator 102) as $C_{ZS}$ in the unit of ADC's LSB.

The zero-scale (ZS) output (with all the input bits set to 0s) ($V_{ZS}$) and the full-scale (FS) output (with all the input bits set to 1s) ($V_{FS}$) of the raw DAC 120 are measured by the ADC (that includes the modulator 102), and measurements are noted as $C_{ZS}$ and $C_{FS}$ respectively.

At step 406, the initial value of i is set to 0 (e.g., taking one bit at a time). At decision step 408, if i is less than the resolution ($N_{DAC}$) of the non-binary DAC 120, at step 414, the DAC input bit Bi is set to 1 and the other input bits are set to 0. At step 416, the non-binary DAC 120 output is measured using an ADC as Cbi and weightage (Wbi) of the bit is calculated and stored as Cbi-$C_{ZS}$. At step 418, the calibration process moves to the next DAC input bit and the control goes back to the decision step 408. If the result of the decision step 408 is no, then at step 410, the input to the non-binary DAC 120 is set to full scale (e.g., all bits are set to 1 or to the highest code stored in the lookup table 122) and at step 412, the non-binary DAC 120 output is measured (using the ADC that includes the delta-sigma modulator 102 and the digital filter 104) and the measured output of the non-binary DAC 120 is stored as full-scale code $C_{FS}$ and the process ends.

As used herein, $C_{ZS}$ is the ADC output code with a zero-scale raw DAC input. $C_{FS}$ is the ADC output code with full-scale raw DAC input. $C_{ZS\_cal}$ is the ADC output code with zero-scale calibrated DAC output as ADC input and $C_{FS\_cal}$ is the ADC output code with full-scale calibrated DAC output as ADC input. The input bits may also be enabled one at a time by applying conversion codes in the lookup table 122 to the non-binary DAC 120 for weightage measurements and bit weightages may be calculated for bits B0, B1, ... $BN_{DAC}-1$ and denoted as WB0, WB1, ..., and $WBN_{DAC}-1$). With the adjustments of the resistive network of FIG. 2, the following equation: $C_{FS}-C_{ZS}=WB0+WB1+\ldots+WBN_{DAC}-1$ may be achieved. Therefore, a code between $C_{ZS}$ and $C_{FS}$ can be approximated by the weightages with a small error. This approximation can be performed by performing a successive approximation register (SAR) conversion in the digital domain with the bit weightages as shown in FIG. 6.

Figure 5:
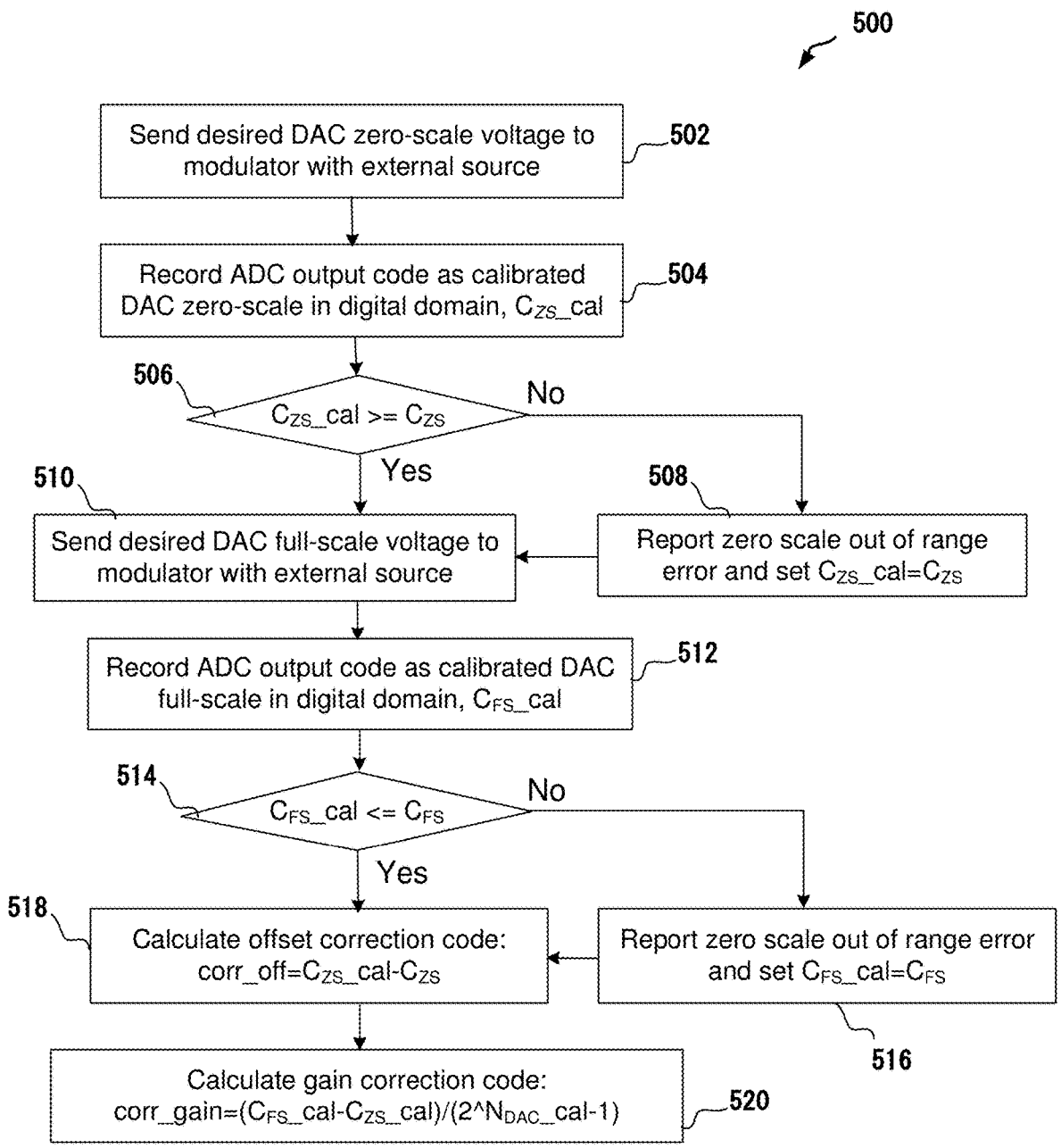
FIG. 5 depicts a flow chart of a method for DAC offset and gain error correction codes calculation in accordance with one or more embodiments of the present disclosure.

FIG. 5 depicts a flow chart 500 of a method for calculating offset and gain error correction codes or coefficients. The offset and gain error corrections relate to the desired calibrated DAC's resolution and output range. Assuming the calibrated DAC requires $N_{DAC\_cal}$ bit resolution, and the zero scale output and the full scale output of the calibrated DAC are $V_{ZS\_cal}$ and $V_{FS\_cal}$. The corresponding ADC (using the modulator 102) outputs are $C_{ZS\_cal}$ and $C_{FS\_cal}$ respectively. $C_{ZS\_cal}$ and $C_{FS\_cal}$ can be obtained by inputting voltages $V_{ZS\_cal}$ and $V_{FS\_cal}$ to the ADC and measuring the outputs of the delta-sigma modulator 102. At step 502, a zero scale voltage is inputted to the ADC (consisting of the modulator 102 and digital filter 104) and at step 504, the output of the ADC is stored as $C_{ZS\_cal}$. At decision step 506, if $C_{ZS\_cal}$ is less than $C_{ZS}$, at step 508, a zero scale out of range error is reported and $C_{ZS\_cal}$ is set to $C_{ZS}$ and control moves to step 510. If at decision step 506, if $C_{ZS\_cal}$ is greater than $C_{ZS}$, at step 510, a predefined full scale voltage is inputted to the delta-sigma ADC including the modulator 102. At step 512, the ADC output code is stored as calibrated DAC full scale ($C_{FS\_cal}$). At decision step 514, if $C_{FS\_cal}$ is greater than $C_{FS}$, at step 516, a zero scale out of range error is reported and $C_{FS\_cal}$ is set to $C_{FS}$ and the control moves to step 518. At decision step 514, if $C_{FS\_cal}$ is less than $C_{FS}$, at step 518, the offset correction code is calculated (corr_offset=$C_{ZS\_cal}-C_{ZS}$). At step 520, the gain correction code is calculated (corr_gain=($C_{FS\_cal}-C_{ZS\_cal}$)/$2^{N_{DAC\_cal}}-1$). During normal operations, the weights and the offset and gain error correction coefficients are used to modify the digital input received through the DAC I/O 114.

Figure 6:
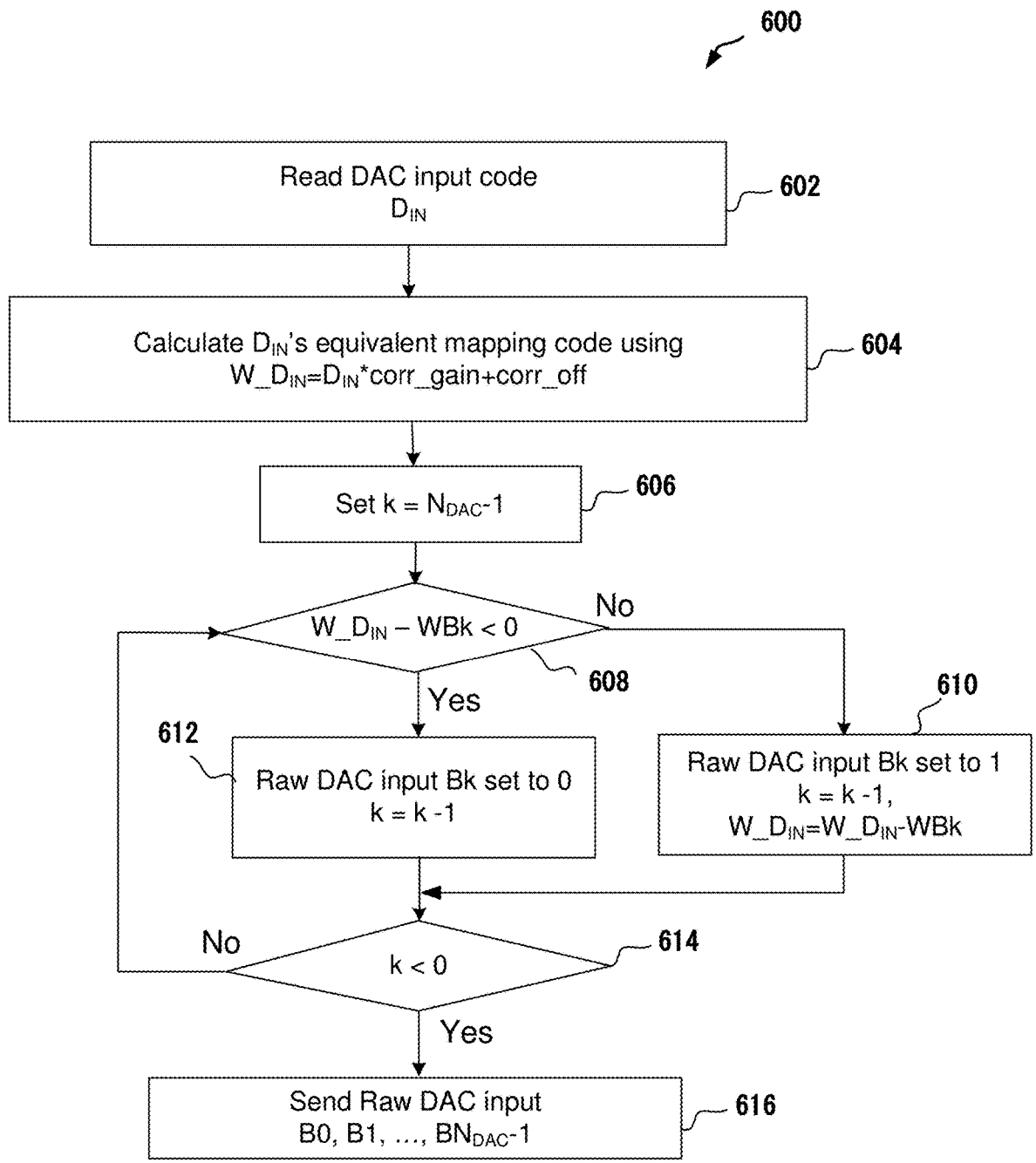
FIG. 6 depicts a flow chart of a method for DAC input code mapping with nonlinearity, gain error and offset corrections in accordance with one or more embodiments of the present disclosure.

FIG. 6 depicts a flow chart 600 of a method for DAC input code mapping (or modifying the input digital code received through the DAC I/O 114) by the conversion module 112. Assuming the input code at the DAC I/O 114 is D™ with $0=<D_{IN}=<2^{N_{DAC\_cal}}-1$. At step 602, the DAC input code ($D_{IN}$) is read via the DAC I/O 114. At step 604, the conversion module 112 applies gain and offset correction coefficients to DAC input code ($D_{IN}$) using the equation $W\_D_{IN}=D_{IN}*corr\_gain+corr\_offset$. At step 606, the kth bit is set to $N_{DAC}-1$. At decision step 608, if the difference of $W\_D_{IN}$ and WBk (kth bit weightage as previously calculated and stored using the method 400) is more or equal to 0, at step 610, the raw DAC input Bk is set to 1 and k is decremented. At this step, $W\_D_{IN}=W\_D_{IN}-WBk$. The control goes to decision step 614. If at decision step 608, if $W\_D_{IN}-WBk$ is less than 0, at step 612 the raw DAC input Bk (e.g., the kth bit) is set to 0 and the bit number k is decremented. At decision step 614, if k is greater than or equal to 0, the control goes to the decision step 608 and if k is less than 0, at step 616, the raw DAC input B0, B1, ... $BN_{DAC}-1$ are sent to the non-binary DAC 120.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A self-calibrating digital-to-analog converter (DAC), comprising:
   an input port;
   a non-binary DAC;
   an ADC including a modulator to receive an output of the non-binary DAC;
   a lookup table to store a plurality of calibration codes;

a calibration logic coupled with the non-binary DAC and in a calibration mode, configured to calculate bit weightages of the non-binary DAC using a calibration code in the plurality of calibration codes and to calculate an offset coefficient and a gain coefficients of the non-binary DAC; and a conversion module to convert, in a normal mode, an input code received via the input port, to a calibrated code using the weight and the offset & gain coefficients.

2. The self-calibrating DAC of claim 1, further including a memory to store the weight and the offset & gain coefficient that are calculated during the calibration mode.

3. The self-calibrating DAC of claim 1, wherein the weight is calculated for a selected bit of the non-binary DAC by measuring an output of the non-binary DAC using the ADC after setting the selected input bit of the non-binary DAC to 1 and setting all other input bits of the non-binary DAC to 0.

4. The self-calibrating DAC of claim 3, wherein the selected bit of the input calibration code is incremented to a next bit until all input bits of the raw DAC are processed using a loop.

5. The self-calibrating DAC of claim 4, wherein the loop is executed for a number of times equal to a resolution of the raw non-binary DAC.

6. The self-calibrating DAC of claim 1, wherein the offset & gain coefficients are calculated by inputting a zero scale voltage to the ADC to obtain a zero scale calibration code ($C_{ZS}$_cal) from the ADC.

7. The self-calibrating DAC of claim 6, wherein the offset & gain coefficients are calculated by inputting a full scale voltage to the ADC to obtain a full scale calibration code ($C_{FS}$_cal) from the ADC.

8. The self-calibrating DAC of claim 7, wherein the offset coefficient is calculated by subtracting a zero scale code from $C_{ZS}$_cal, wherein the zero scale code is obtained at the output of the ADC by inputting a zero scale code from the lookup table into the non-binary DAC and measuring the DAC output using the ADC.

9. The self-calibrating DAC of claim 8, wherein the gain coefficient is calculated using an equation ($C_{FS}$_cal–$C_{ZS}$_cal)/$2^{N_{DAC}\_cal}$–1), wherein $N_{DAC}$_cal is a resolution of the self-calibrating DAC.

10. A method for self-calibrating a digital-to-analog converter (DAC) having a resolution, comprising:
in a calibration mode,
calculating a weight of a non-binary DAC using an ADC;
calculating an offset coefficient of the non-binary DAC;
calculating a gain coefficient of the non-binary DAC; and
in a normal mode,
converting an input digital code to a calibrated non-binary input code using the weight, the offset coefficient and the gain coefficient.

11. The method of claim 10, wherein the weight is calculated for a selected input bit of the non-binary DAC by measuring an output of the non-binary DAC using the ADC after setting the selected input bit of the non-binary DAC to 1 and setting all other input bits of the non-binary DAC to 0.

12. The method of claim 11, wherein the selected input bit of the non-binary DAC is incremented to a next bit until all input bits of the non-binary DAC are processed using a loop.

13. The method of claim 12, wherein the loop is executed for a number of times equal to a resolution of the non-binary DAC.

14. The method of claim 10, wherein the offset coefficient and the gain coefficient are calculated by inputting a zero scale voltage to the ADC to obtain a zero scale calibration code ($C_{ZS}$_cal) from the ADC.

15. The method of claim 14, wherein the offset coefficient and the gain coefficient are calculated by inputting a full scale voltage to the ADC to obtain a full scale calibration code ($C_{FS}$_cal) from the ADC.

16. The method of claim 15, wherein the offset coefficient is calculated by subtracting a zero scale code from $C_{ZS}$_cal, wherein the zero scale code is obtained at the output of the ADC by inputting a zero scale code into the non-binary DAC and measuring an output of the non-binary DAC using the ADC.

17. The method of claim 16, wherein the gain coefficient is calculated using an equation ($C_{FS}$_cal–$C_{ZS}$_cal)/$2^{N_{DAC}\_cal}$–1), wherein $N_{DAC}$_cal is the resolution.

18. The method of claim 10, wherein the converting includes reading a digital input code and multiplying the input code by the gain coefficient and adding the offset coefficient.

19. The method of claim 10, wherein the converting includes reading a digital input code and applying the gain coefficient and the offset coefficient to the digital input code.

* * * * *